United States Patent [19]

Lin et al.

[11] Patent Number: 6,150,263
[45] Date of Patent: Nov. 21, 2000

[54] METHOD OF FABRICATING SMALL DIMENSION WIRES

[75] Inventors: Kevin Lin, Taipei Hsien; Ching-Chiao Hao; Kun-Chi Lin, both of Hsinchu, all of Taiwan

[73] Assignee: United Microelectronics Corp., Hsinchu, Taiwan

[21] Appl. No.: 09/188,920

[22] Filed: Nov. 9, 1998

[51] Int. Cl.⁷ .................................................. H01L 21/44
[52] U.S. Cl. ............................................. 438/652; 438/652
[58] Field of Search ................................ 438/585, 592, 438/595, 717, 734, 736, 737, 738, 739, 652; 430/316; 216/41

[56] References Cited

U.S. PATENT DOCUMENTS

| | | | |
|---|---|---|---|
| 5,776,821 | 7/1998 | Haskell et al. | 438/585 |
| 5,902,133 | 5/1999 | Linliu | 438/717 |
| 6,010,829 | 1/2000 | Rogers et al. | 430/316 |

*Primary Examiner*—David Nelms
*Assistant Examiner*—David Nhu
*Attorney, Agent, or Firm*—Hickman Coleman & Hughes, LLP

[57] ABSTRACT

A method of forming small dimension wires by an isotropic removal process. The method provides a substrate with an insulation layer. A first conductive layer and a second conductive layer are formed on the insulation layer. A wire pattern is formed on a photoresist layer after the coating process and the sequential exposure and development process. Part of the second conductive layer is removed by using the wire pattern on the photoresist layer as a mask, and thus part of the second conductive layer with wires is remained. Isotropic etching the peripheral part of the second conductive layer and thus the part of wire pattern with a smaller dimension is remained. Using the wire pattern with a smaller dimension as a mask to anisotropic etch the first conductive layer until the surface of the insulation layer is exposed, and thus the process of fabricating small dimension is finished.

15 Claims, 2 Drawing Sheets

METHOD OF FABRICATING SMALL DIMENSION WIRES

BACKGROUND OF THE INVENTION

1. Field of Invention

The present invention relates to a method of fabricating integrated circuits. More particularly, the present invention relates to a method of fabricating small dimension wires in integrated circuits.

2. Description of Related Art

With steadily increasing integration in integrated circuit (IC) fabrication, the dimensions of IC devices are greatly reduced. Accordingly, in a process of fabricating dynamic random access memory (DRAM), the areas of a metal oxide semiconductor (MOS) have to be made very small. However, due to limitations imposed by the resolution of the photolithographic process, bit lines cannot be fabricated with a very narrow width. Thus, in the following process, there is not much space for node contact windows and the alignment has to be very accurate.

Conventional method of fabricating bit lines is sequentially forming a silicon oxide layer, a doped polysilicon layer, and a tungsten silicide layer on the substrate. Then a photoresist layer is coated on the tungsten silicide layer. After the process of exposure and development, part of the photoresist layer with a bit line pattern is formed.

The bit lines are defined by using the bit line pattern of the photoresist layer as a mask to etch the tungsten silicide layer and the doped polysilicon layer by an anisotropic etching process, thus defining the bit lines. The photoresist layer is removed, while the bit lines including the tungsten silicide-tungsten silicide layer and doped polysilicon layer are remained.

Openings lie between the bit lines, and the width of openings is the largest dimension that the node contact windows can be formed in the subsequent processes. Narrower bit lines would allow wider openings, which in turn would allow a higher tolerance for node contact window accuracy. A higher tolerance would significantly reduces the difficulty of the process.

It can be seen that conventional processes are not able to meet the demands of current technology. For example, in a 0.21 $\mu$m DRAM, it is necessary to fabricate lines with dimensions less than 0.15 $\mu$m. At present, this requires a better stepper in the photolithography process.

SUMMARY OF THE INVENTION

Accordingly, the present invention provides a method of fabricating small dimension wires including bit lines that uses the conventional stepper and still fabricates wires with small dimensions.

To achieve these and other advantages and in accordance with the purpose of the invention, as embodied and broadly described herein, the invention provides a method of fabricating small dimension wires. A substrate comprising an insulation layer is provided. A first conductive layer and a second conductive layer are sequentially formed on the substrate. A photoresist layer is coated on the second conductive layer. After the process of exposure and development, a wire pattern is formed on the photoresist layer. The wire pattern on the photoresist layer is used as a mask to remove a part of the second conductive layer, while the remaining part of the second conductive layer is used to form wires. Isotropic etching is used to remove some thickness of the peripheral part of the second conductive layer, thus leaving a wire pattern with smaller dimensions. The wire pattern with smaller dimensions is used as a mask to etch the first conductive layer by an anisotropic etching process until the surface of the insulation layer is exposed, and small dimension wires are formed.

In the present invention, after using the wire pattern on the photoresist layer as a mask to remove a part of the second conductive layer, the remaining part of the second conductive layer is again processed in an isotropic etching process. Thus the wire pattern with narrower dimensions is formed and small dimension wires are formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
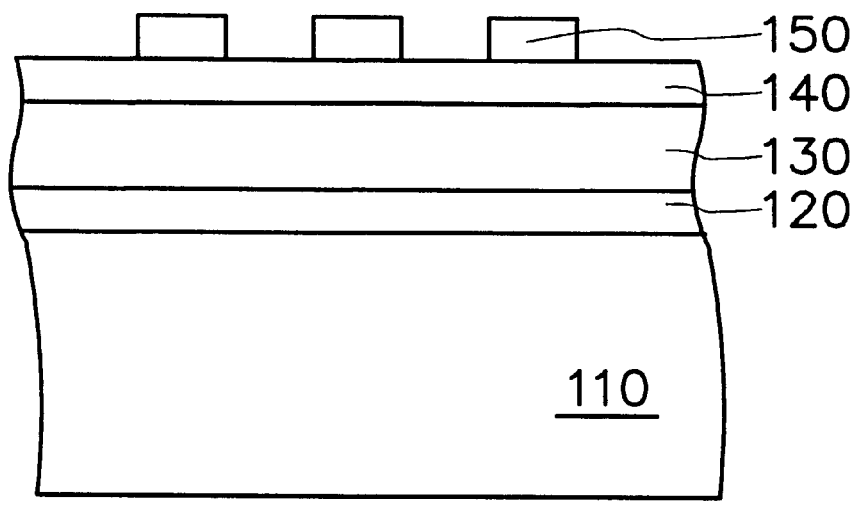
FIGS. 1A to 1D are schematic, cross-sectional views of steps taken in the process of fabricating wires according to a preferred embodiment of the invention.

Reference will now be made in detail to the present preferred embodiment of the invention, an example of which is illustrated in the accompanying drawings. Wherever possible, the same reference numbers are used in the drawings and the description to refer to the same or like parts.

Referring to FIG. 1A, a substrate 110 with an insulation layer 120 is provided, wherein the material of the insulation layer 120 can be silicon dioxide formed by atmospheric pressure chemical vapor deposition (APCVD). Tetraethyl orthosilicate is used as a source gas, the temperature is between 650° and 750° C., and the pressure is between 1 torr and 10 torr.

A first conductive layer 130 is formed on the insulation layer 120. The first conductive layer 130 is, for example, doped polysilicon, and is formed by APCVD using silane as source gas, at a temperature of between 600° and 650° C., and a pressure of between 0.3 torr and 0.6 torr.

A second conductive layer 140 is formed on the first conductive layer. The material of the second conductive layer comprises tungsten silicide, and is formed, for example, by LPCVD using tungsten hexafluoride as a source gas, at a temperature of between 300° C. and 400° C., and a pressure of between 0.3 torr and 1 torr.

A photoresist layer is coated on the second conductive layer 140. After a process of exposure and development, a photoresist layer with bit lines pattern 150 is formed.

Figure 1B:
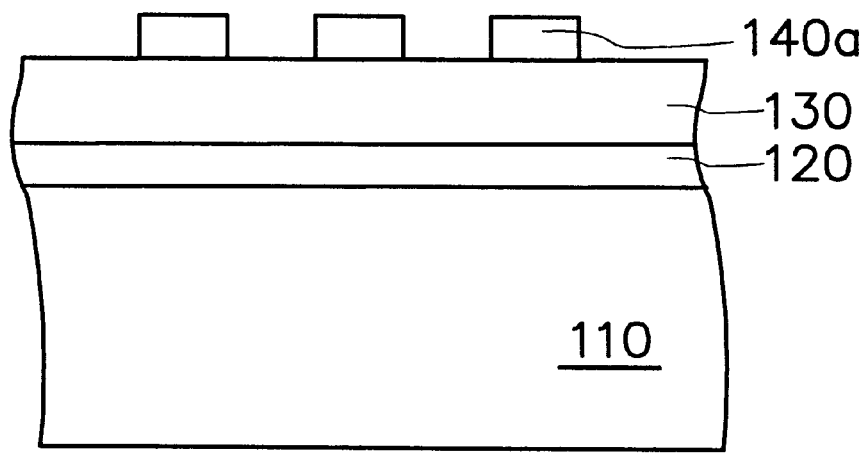

Referring to FIG. 1B, part of the second conductive layer 140 is removed to leave a portion of the second conductive layer 140a with the bit line pattern by using the photoresist layer with bit lines pattern 150 as a mask. The portions of the second conductive layer are removed by anisotropic etching, for example. If the second conductive layer 140 is made of tungsten silicide, reactive ion etching (RIE) using fluorine and chlorine as gas source can be used to etch the second conductive layer 140. The photoresist layer is removed, for example, by oxygen plasma, and then the ashes left are removed by chemical solution.

Figure 1C:
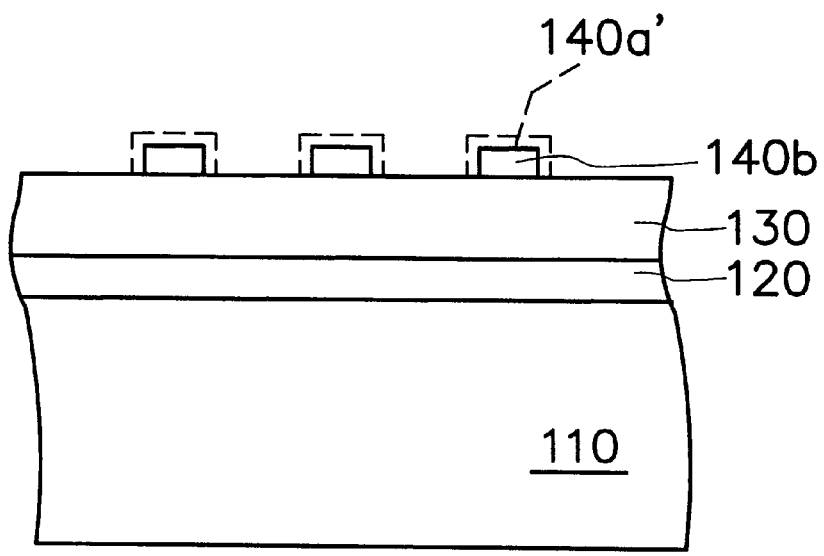

Referring to FIG. 1C, the peripheral part 140a' of the bit line pattern 140a is removed. Therefore a part of the second conductive layer 140b with a smaller dimension is left. The peripheral part 140a' is, for example, removed by isotropic etching. If the material used for the second conductive layer 140 is tungsten silicide, a wafer can be dipped in a solution that comprises ammonia and hydro peroxide and etched.

Figure 1D:
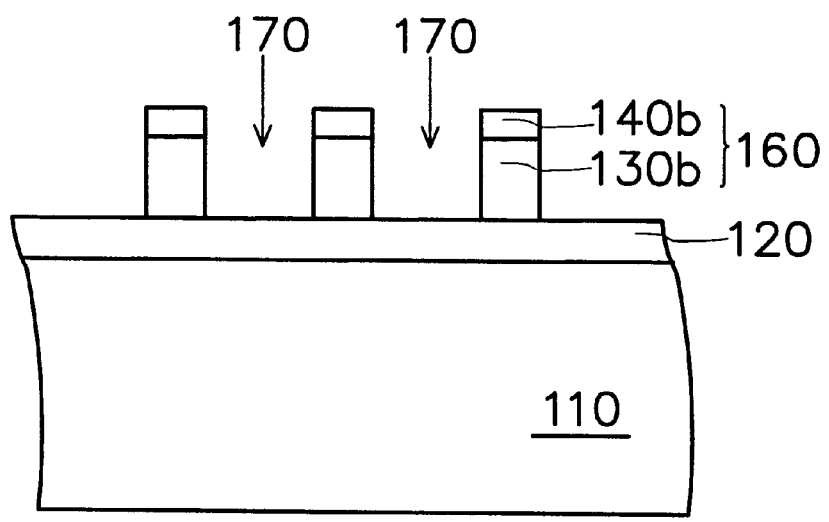

Referring to FIG. 1D, the bit line pattern of the second conductive layer 140b is used as a mask to anisotropically etch the first conductive layer 130 until the surface of the insulation layer 120 is exposed, so that part of the first conductive layer 130b remains. The method used to remove the first conductive layer 130 and the second conductive layer must have very good etching selectivity. If the material of the first conductive layer 130 is doped polysilicon, a RIE process using chlorine as gas source can be used. The dimensions of the bit lines 160 formed by part of the first conductive layer 130b and part of the second conductive layer 140b are smaller and thus the area of the windows 170 between the bit lines 160 are relatively larger. In this manner, the demand of alignment accuracy to the subsequently formed node contact can be lower.

The wires in the embodiment can be bit lines, but they can also be any other interconnects in an integrated circuit.

Accordingly, it is to be understood that the invention has the advantage of a simple fabricating process. In the whole process of fabricating wires, there is no need to add an additional photolithographic process, and the other processes are all the same. Further, if wet etching is used in the isotropic removing process, the ashes can be removed in the same machine tool so that no further appliances or processes are needed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a plurality of small dimension bit lines on a substrate comprising an insulation layer, wherein a first conductive layer is on the insulation layer and a second conductive layer is on the first conductive layer, the method comprising the steps of:

performing a photolithography and etching process on the second conductive layer to form a first bit line pattern;

removing the photoresist;

etching the second conductive layer to form a second bit line pattern with a dimension smaller than the first bit line pattern; and etching the first conductive layer in an anisotropic etching process by using the second bit lines pattern on the second conductive layer as a mask until the insulation layer is exposed.

2. The method of claim 1, wherein the isotropic etching process comprises a wet etching process.

3. The method of claim 2, wherein the wet etching process uses a solution that comprises ammonia and hydrogen peroxide.

4. The method of claim 1, wherein the anisotropic etching process comprises a dry etching process.

5. The method of claim 1, wherein the first conductive layer comprises doped polysilicon.

6. The method of claim 1, wherein the second conductive layer comprises tungsten silicide.

7. A method of fabricating small dimension wires formed on a substrate comprising an insulation layer, wherein a first conductive layer is on the insulation layer, and a second conductive layer is on the first conductive layer the method comprising the steps of:

patterning the second conductive layer to form a first wire pattern, the resulting first wire pattern being substantially free from photoresist;

minifying the first wire pattern; and etching the first conductive layer with the first wire pattern as a mask until the insulation layer is exposed.

8. The method of claim 7, wherein the second conductive layer comprises tungsten silicide.

9. The method of claim 7, wherein the first wire pattern is minified in the following step:

etching the second conductive layer with a first wire pattern.

10. The method of claim 7, wherein the first conductive layer with the first wire pattern is etched by an anisotropic etching process.

11. The method of claim 10, wherein the anisotropic etching process is performed using a liquid that comprises ammonia and hydrogen peroxide.

12. The method of claim 10, wherein the anisotropic etching process comprises a wet etching process.

13. The method of claim 7, wherein the first conductive layer comprises doped polysilicon.

14. The method of claim 7, wherein the conductive layer comprises metals with low resistance.

15. A method for fabricating a bit line structure, wherein a substrate comprising an insulation layer formed thereon is provided, comprising:

forming a plurality of conductive layers for the bit line structure on the insulation layer;

patterning a first conductive layer of the bit line structure, the resulting patterned first conductive layer being substantially free from photoresist;

dipping the first conductive layer of the bit line structure in a solution of ammonia and hydrogen peroxide; and etching the second conductive layer of the bit line structure using the first conductive layer as a mask.

* * * * *